United States Patent

[11] 3,621,292

[72] Inventors Charles B. Vogel;
Alton O. Christensen, both of Houston, Tex.
[21] Appl. No. 879,222
[22] Filed Nov. 24, 1969
[45] Patented Nov. 16, 1971
[73] Assignee Shell Oil Company
New York, N.Y.
Continuation-in-part of application Ser. No. 782,561, Dec. 10, 1968, now Patent No. 3,502,909.

[54] PULSED SUBSTRATE TRANSISTOR INVERTER
5 Claims, 4 Drawing Figs.

[52] U.S. Cl. .......... 307/251,
307/205, 307/214, 307/246, 307/303, 307/304, 307/316, 307/317
[51] Int. Cl. .......... H03k 17/60
[50] Field of Search .......... 307/205, 246, 251, 279, 304, 303, 311, 317, 214; 328/100

[56] References Cited
UNITED STATES PATENTS
3,348,064 10/1967 Powlus .......... 307/205
3,418,495 12/1968 Bose .......... 307/246 X
OTHER REFERENCES
Froemke, "Insulated Gate-Field-Effect Transistor Circuit," IBM Technical Disclosure Bulletin Vol. 9, No. 9, February 1967, pp. 1234 & 1235. 307/251

*Primary Examiner*—Stanley T. Krawczewicz
*Attorneys*—J. H. McCarthy and T. E. Bieber

ABSTRACT: An inverter circuit for field-effect transistors consisting of at least one transistor with a capacitor connected between the source electrode and ground, a diode connected between the drain and source electrodes and a source of negative clock pulses tied to the drain electrode and substrate electrode.

INVENTORS:
A. O. CHRISTENSEN
C. B. VOGEL

PULSED SUBSTRATE TRANSISTOR INVERTER

CROSS-REFERENCE TO RELATED APPLICATIONS

The present application is a continuation-in-part of an copending application Ser. No. 782,561, filed Dec. 10, 1968, now U.S. Pat. No. 3,502,909, by the same inventors as the present application.

BACKGROUND OF THE INVENTION

The invention, in general, relates to transistor-inverting circuits and more particularly to a field-effect transistor-inverting circuit with substantially improved properties.

Field-effect transistors can conveniently be broken down into the junction type and the insulated-gate-type (IGFET.) Of the IGFET-type, the metal-oxide-silicon field-effect transistor (MOSFET) is presently the most popular. These devices have the features of a solid-state voltage amplifier with very high input impedance and a transfer characteristic similar to that of a vacuum tube pentode. In many ways these devices combine the most attractive features of the transistor and the vacuum tube. In addition to small size, reduced power, and mechanical ruggedness, the MOSFETS offer nearly complete isolation of input from output. In the field of integrated circuits, MOSFETS may be used to create substantially more complex functions on the same amount of silicon surface.

Although the invention is generally applicable to all field-effect transistors, it will be explained in terms of the MOSFET and, more particularly, in terms of the P-channel enhancement mode of operation.

To understand how MOSFET circuits operate, it is valuable to understand the structure and operation of the actual MOSFET devices. FIG. 1 shows a single MOSFET transistor in cross section. It consists of a block of $N^-$-silicon, called the substrate, into which $P^+$-impurities, such as boron, are diffused in two parallel stripes. The $P^+$-parallel stripes are known as the source and drain. The surface of the silicon is covered by a protective layer of silicon dioxide, which is naturally formed during the process by which the devices are made. Tiny windows are etched through the silicon to the source and drain region and metallic contacts are deposited thereon. The gate is a metallic conductor deposited over the oxide on that region between the source and drain. It makes no electrical or physical contact with the silicon substrate but interacts therewith through a field-effect. If the gate, source, and substrate are grounded and a negative voltage is supplied to the drain, no current will flow between source and drain, since the drain-to-substrate PN junction is reverse-biased. As a result, the source and drain are isolated from each other. However, if a negative voltage is applied to the gate, electrons are repelled from the surface region of the silicon immediately under the gate and holes are attracted thereto. As the gate-source voltage becomes more negative, the surface region finally changes from N-type and becomes a P-type material. This is known as inversion, and the newly created P-region (shown as a dotted line in FIG. 1) is called a channel. The P-channel provides a path for conduction of the charge carriers between the source and drain. With a negative voltage on the drain and the source at ground potential, or vice versa, a current will flow through the P-channel. The resistance to current flow presented by the P-channel is called the on-resistance of the transistor and is small compared to the off-resistance (no signal on the gate.) For example, the off-resistance may be several million ohms whereas the on-resis-tance may typically be between 500 and 5,000 ohms.

Before the surface can be inverted to form a channel, the gate voltage must reach a certain critical level called the threshold voltage, $V_t$, which physically is the voltage necessary to neutralize the surface charges. Typical processing can achieve a $V_t$ of from 3 to 5 volts. As the gate voltage becomes more negative than $V_t$, the channel depth, and hence the conduction path, increases. By varying the gate voltage, it is possible to modulate the P-channel and thereby vary the on-resistance. Thus since current flow through the P-channel is controlled by the on-resistance, the gate voltage can be used to vary the current.

In determining the usefulness of a particular MOSFET circuit, there are several circuit properties or parameters that must be considered together. For example, it is recognized that the circuits should take up as little space on the semiconductor chip as possible, so that the cost per circuit is minimized. Power dissipation should be small to avoid cooling problems. And it is nearly always desirable that the circuits be able to operate as fast as is possible.

As would be expected, circuit designers are always looking for ways of upgrading these parameters. Yet, after years of effort, field-effect transistor circuits still remain relatively slow when compared with the bipolar transistor. Being slow, FET circuits are not competitive with traditional bipolar transistor circuits in many applications, such as logic and memory cell components, such as inverters. This is true even though many other FET circuit parameters such as power dissipation, size, and input-output isolation are superior to those of bipolar transistor circuits. It is, therefore, a primary object of this invention to provide a substantially faster FET circuit.

A further object of the invention is to provide an inverter circuit that does not require a DC-bias voltage.

A further object of the invention is to provide an inverter circuit requiring less power than was heretofore possible.

A further object is to provide an inverter circuit that takes up a smaller area on the semiconductor chip that was heretofore possible by the use of minimum-area transistors.

A further object of this invention is to provide an inverter circuit requiring only one field-effect transistor.

Finally, it is an object of the invention to provide a very simple, low-cost, and fast logic-building block from which other more sophisticated logic circuits, such as AND, OR, NOR, flip-flops, and the like, can be fabricated.

For a better understanding of how the present invention achieves the above objects, it is worthwhile to briefly describe the prior art. FIG. 2 illustrates the relationship between the actual physical embodiment of a MOSFET as shown in FIG. 1 and the conventional circuit diagram symbol. The dotted line represents the silicon substrate whereas the solid lines are the circuit diagram symbol. In all known prior art applications of the field-effect transistor, the substrate of the device is grounded. In fact, the substrate terminal is rarely indicated in circuit diagrams. With the substrate grounded, the field-effect transistor more closely resembles other basic 3-terminal devices familiar to designers such as the conventional bipolar transistor and triode. But, by considering the field-effect transistor as having only the source drain and gate electrodes with which to work and overlooking the possibilities of the substrate electrode, prior circuit designers left undiscovered some very remarkable circuits as will now be described.

SUMMARY OF THE INVENTION

The invention of the copending application can be practiced using either two transistors in a parallel configuration or a single transistor. In the case of the two transistors, the clock pulse is supplied to the substrate of both and the drain electrode of both plus the gate electrode or control electrode of one. The data is applied to the control gate of the other transistor, while the output pulse appears at the interconnected drain electrodes.

In both the single transistor and the parallel transistor configuration, a capacitor is coupled between the source and ground. In the single-device configuration, the circuit that includes a transistor having a gate electrode, a substrate electrode and two additional electrodes a capacitor is connected between one of the additional electrodes and ground. The other additional electrode and the substrate are connected to a source of clock pulses. The data input to this circuit is through the gate electrode and the output is taken at the common point between the capacitor and the additional electrode.

While the inverter circuit of the copending application is successful, it requires that the clock pulse be applied to both the substrate and drain electrode. Thus, the clock pulses are applied to the entire substrate of the chip with the result that only circuits requiring a pulsed substrate may be deposited on the chip. Normally, several hundred circuits are deposited on a single chip of semiconductor material. As a result the circuit of the copending application is limited in its application.

The present invention solves the above problem by substituting a separate diode for the diode junction formed by the pulsed substrate of the circuit of the copending application. The diode may be either external or intrinsic to the MOSFET. When the diode is external, it can be formed by diffusing or doping metal on the substrate between the source and drain electrodes. The intrinsic diode effect of a MOSFET can be used as a diode as explained in the copending application.

In addition to the above structure, the external diode can also be formed as a photoconductor diode. This permits controlling the charging of the capacitor of all inverter circuits by flashing a light without having a discrete connection to each inverter circuit on the chip. The elimination of a clock pulse connection to each circuit simplifies the fabrication of a chip and reduces the possibility of a faulty connection and the loss of a chip.

PREFERRED EMBODIMENT OF THE INVENTION

Figure 1:
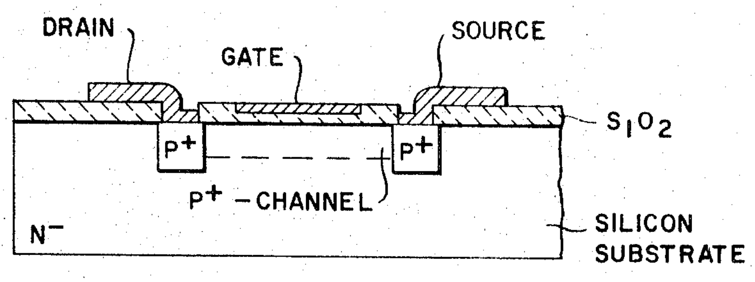
FIG. 1 is a diagrammatic illustration of a MOSFET in cross section.
Figure 2:
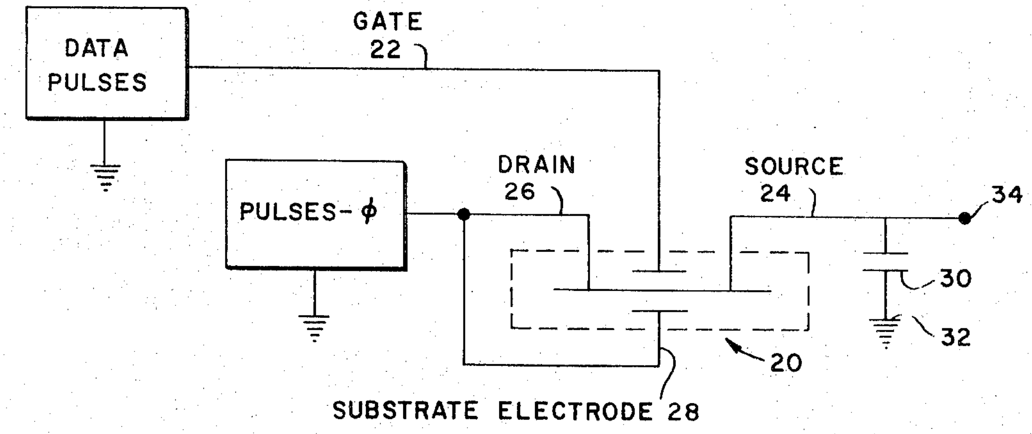
FIG. 2 is a schematic diagram of the circuit of the copending application.

Referring now to FIG. 2, there is shown the circuit of the copending application wherein an insulated gate field-effect transistor (IGFET) 20 having a gate or control electrode 22, a substrate electrode 28, and two additional electrodes 24 and 26. By convention, the additional electrode closest to ground, in this case electrode 24, is referred to as the source electrode and the other electrode 26 as the drain electrode. Terminal 26 is connected to a source of low-impedance clock, Φ, the source generally having an internal impedance, RΦ, of 50 ohms or less, and capable of generating narrow-width, fast rise-time pulses. For example, pulses in the range of 5 to 50 nanoseconds are desirable. The pulse width and the cycle time are, of course, a matter of some choice, but generally the narrower the pulse width, the faster the cycle time and the faster the general operation of the circuit.

A source of clock pulses is nearly always used in computers so that the thousands of component circuits can be operated together with the clock, to avoid complex timing problems. Thus, the use of the clock in the present circuit is not an added complication.

A capacitor 30 is connected between the source electrode 24 and signal ground 32, with the circuit output 34 taken at the common point between source 24 and capacitor 30. Capacitance 30 exists between source electrode 24 and signal ground 32. Capacitor 30 includes the capacitance of the following stage or loading capacitance driven by the inverter, including parasitic capacitance. Unlike the pulsed-substrate inverter, the capacitor 30 is preferably not a separate capacitor.

The circuit of FIG. 2 operates by applying clock pulses to the drain and substrate to charge the capacitor 30. The diode created between the P-material forming the drain and the N-material forming the substrate is biased on by leading edge of the clock pulse. This assumes that the clock pulse is a negative pulse with respect to the system. The termination of the clock pulse turns off the diode and isolates the charge on the capacitor. Thus a "zero" level input data signal on the control electrode produces a "one" level output signal.

When a negative pulse "one" level data pulse is applied to the control electrode and it persists after the termination of the clock pulse, the capacitor will discharge through on resistance of the MOSFET plus the resistance of the clock. Thus for a "one" level input there will be a "zero" level output.

Figure 3:
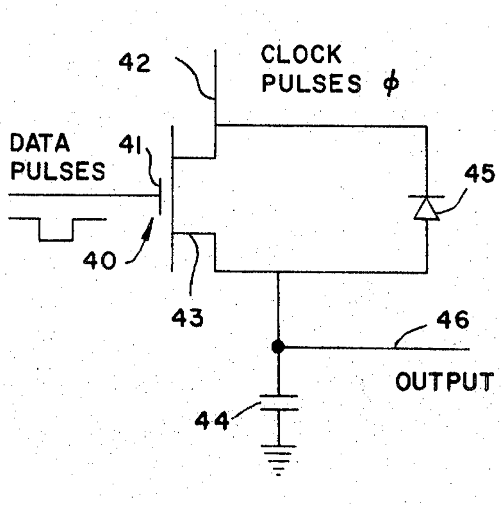
FIG. 3 is a schematic diagram of the circuit of the present invention.

Referring to the FIG. 3, there is shown a circuit constructed according to the present invention. The MOSFET 40 is provided with a control or gate electrode 41, drain electrode 42 and source electrode 43. The drain and source electrodes are connected together with a diode 45 being disposed in this connection. As explained, this diode can be either external or intrinsic. The diode may be a Schottky-barrier-type, formed by metal making contact with the drain $P^+$-diffusion, 42, and overlaying the source $P^+$-diffusion 43. The metal overlay of 42 forms the Schottky diode according to techniques known in the art. The metal used to form the Schottky diode may be of photoemissive characteristic such as a trialkylide, making the diode photoconductive. The circuit is completed by a capacitor 44 disposed between the source electrode and ground.

The negative clock pulses are applied to the drain electrode and turn on the diode 45 and charge the capacitor. In the absence of a data pulse, the charge will remain on the capacitor. Thus, for a "zero" level input, there is a "one" level output. When a data pulse is present, it will provide a discharge path for the capacitor through the on-resistance of the MOSFET. Thus, for a "one" level input there will be a "zero" level output. The output signal lead 46 is connected to the source electrode.

Figure 4:
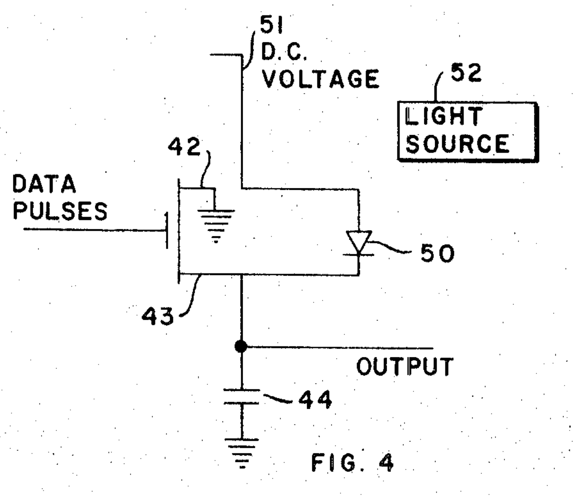
FIG. 4 is a schematic diagram of a modified form of the invention.

When a junction-type, photoconductive diode 50 is used, as shown in FIG. 4, it should preferably be disposed with connections reversed with respect to those of the diode 45. The external connection for applying clock pulses is replaced by a source 51 of DC voltage and the upper or drain electrode is grounded. Otherwise, the capacitor will always be charged negatively with respect to ground, either through forward conduction through the diode, or through MOSFET. The clock pulses are used to flash a light source 52 disposed to illuminate the photoconductive diode. The light can be disposed to illuminate a large number of diodes and thus control a large number of circuits. The light striking the diode will cause it to conduct and allow the capacitor to charge from the DC voltage. The light source can be any type of light having infrared in its spectrum since most photoconductive diodes respond to infrared radiation. The capacitor will retain the charge and thus a "zero" level input signal will produce a "one" level output signal. If a data pulse is applied to the gate electrode and remains after the photoconductive diode is turned off the capacitor will discharge through the on resistance of the MOSFET. This will produce a "zero" level output pulse for a "one" level data pulse. Alternatively a purely photoresistive diode may be used at 50 in which case no attention need be paid to the polarity of its connections; or similarly, two back-to-back series photodiodes may be used. As a still further alternative, diode 45 in FIG. 3 may be replaced by a photovoltaic diode with polarity opposite to that shown in FIG. 3 and the drain 42 grounded. In this case, however, the output logic level is limited to about .6 volts.

The circuit of the present invention achieves the same results as the circuit of the copending application with advantage of one less connection and removal of the clock pulse from the substrate. This improves the reliability of the chip and allows the use of different circuits on the same chip.

We claim as our invention:

1. A transistor circuit for use in logic networks comprising:

a data input transistor having a control electrode and two additional electrodes;

a load capacitor;

a junction diode with two electrodes;

means for connecting said diode and capacitor in series;

means for applying across said series connection of said diode and capacitor a voltage of polarity to produce forward conduction of current through said diode to charge said capacitor;

means for connecting said two additional transistor electrodes in a conduction path in series circuit with the electrodes of said capacitor to provide a discharge path for the capacitor; and means for selectively applying data signals to said control electrode to control the charge remaining upon said capacitor during the period following the application of said voltage.

2. The circuit of claim 1 wherein said transistor is a field-effect transistor, said control electrode being the gate electrode, and said two additional electrodes are the source and drain electrodes.

3. The circuit of claim 1 wherein said diode is a photoconductive diode.

4. The circuit of claim 1 wherein said diode is a diffusion junction of one of said electrodes.

5. An inverter circuit for use in integrated circuits comprising:

a field-effect transistor having a gate electrode and source and drain electrodes;

a load capacitor;

diode means;

means for connecting the diode and capacitor in series;

means adapted to be coupled to a source of pulses for applying across said series connection of the diode and capacitor electrical pulses of polarity to produce forward conduction of current through the diode to charge the capacitor;

means for connecting the source and drain electrodes of the fiedl-effect transistor in series circuit with the capacitor and the source of pulses to provide a discharge path for the capacitor during time periods between the pulses; and means for selectively applying data signals to said gate to control discharge of the capacitor.